(12) United States Patent
Danbata et al.

(10) Patent No.: US 8,558,990 B2
(45) Date of Patent: Oct. 15, 2013

(54) METHOD OF EXPOSING A SEMICONDUCTOR WAFER AND EXPOSURE APPARATUS

(75) Inventors: Masayoshi Danbata, Tokyo (JP); Hisanori Ueno, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 335 days.

(21) Appl. No.: 13/067,139

(22) Filed: May 11, 2011

(65) Prior Publication Data

US 2011/0279798 A1 Nov. 17, 2011

(30) Foreign Application Priority Data

May 13, 2010 (JP) ................. P2010-111170

(51) Int. Cl.
*G03B 27/52* (2006.01)
*G03B 27/32* (2006.01)

(52) U.S. Cl.
USPC .............................................. 355/55; 355/77

(58) Field of Classification Search
USPC .................... 355/52, 53, 55, 67, 77; 430/311; 356/399–401; 250/548
See application file for complete search history.

(56) References Cited

U.S. PATENT DOCUMENTS

| | | | | |
|---|---|---|---|---|
| 5,424,552 A * | 6/1995 | Tsuji et al. | | 250/548 |
| 6,090,510 A * | 7/2000 | Tokuda | | 430/30 |
| 6,657,215 B2 * | 12/2003 | Sakamoto et al. | | 250/548 |
| 8,373,845 B2 * | 2/2013 | Fujisawa | | 355/55 |

FOREIGN PATENT DOCUMENTS

| | | |
|---|---|---|
| JP | 1-264220 A | 10/1989 |
| JP | 10-270317 A | 10/1998 |

* cited by examiner

*Primary Examiner* — Hung Henry Nguyen

(74) *Attorney, Agent, or Firm* — McGinn IP Law Group, PLLC

(57) ABSTRACT

An exposure method includes the following processes. An autofocus scan process is performed to detect a defocused portion of a first resist film over a semiconductor wafer and to generate a detection signal that indicates the defocused portion detected. A first exposure scan process is performed while selectively blinding the first resist film, with reference to a detection signal related to the defocused portion detected.

20 Claims, 10 Drawing Sheets

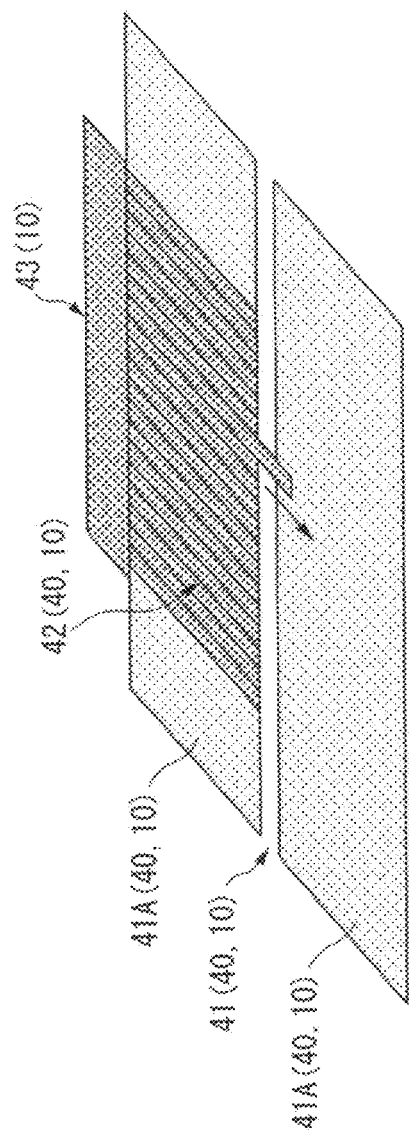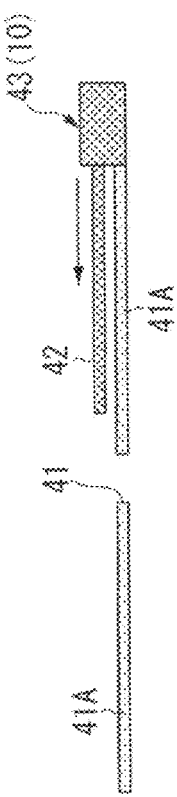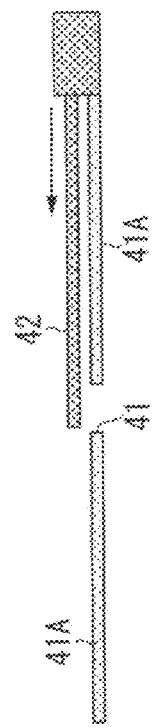

FIG. 10A
FIG. 10B
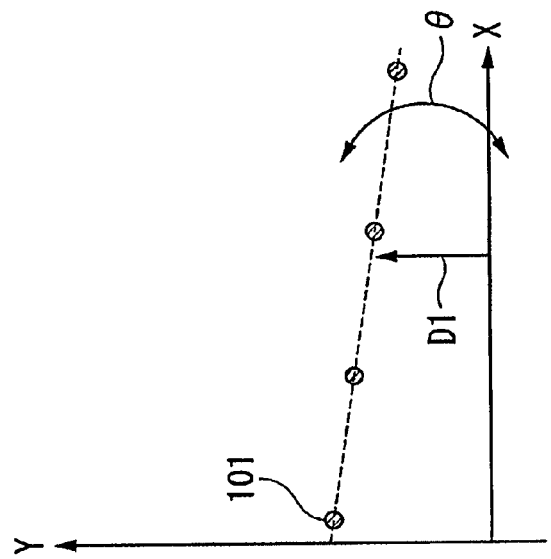
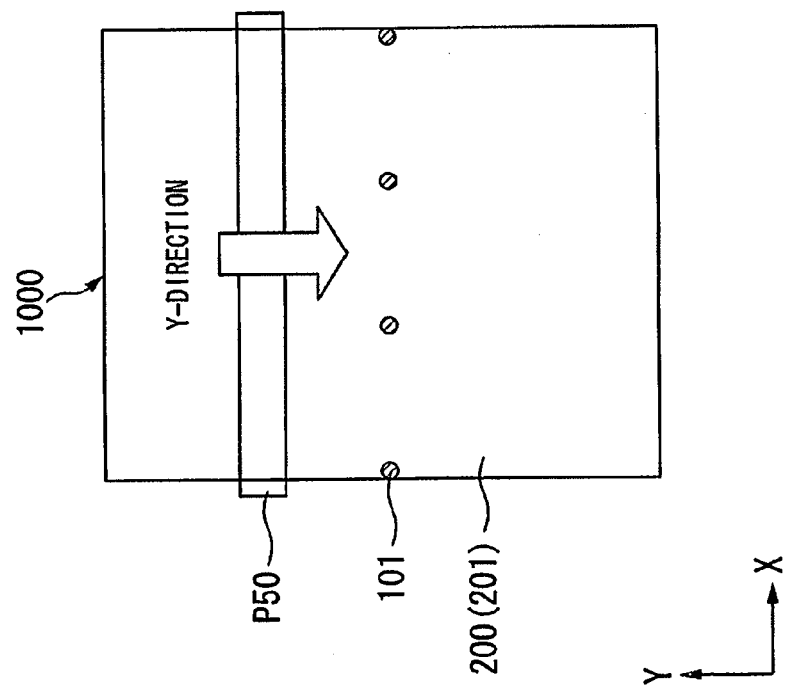

METHOD OF EXPOSING A SEMICONDUCTOR WAFER AND EXPOSURE APPARATUS

BACKGROUND OF THE INVENTION

1. Field of the Invention

The disclosure relates to a method of exposing a semiconductor wafer and an exposure apparatus for semiconductor wafer.

Priority is claimed on Japanese Patent Application No. 2010-111170, filed May 13, 2011, the content of which is incorporated herein by reference.

2. Description of the Related Art

In recent years, with the increase in the diameter of semiconductor wafers in the semiconductor manufacturing process, in order to reduce the cost of the lithographic exposure process used to form resist patterns, there has been an increase in the shot surface area. However, because of the reduction of the DOF (depth of focus) and adoption of micro-patterns, there tends to be defocusing, making it difficult to achieve high manufacturing yield. This defocusing refers to the out-of-focus condition (defocusing) during lithographic exposure, caused by unwanted matter on the rear surface of the wafer mainly in the semiconductor manufacturing process, accompanied by a reduction in the planarity of the surface of the wafer.

In the lithographic exposure process step, if the above-mentioned type of defocused portion occurs on the surface of the semiconductor wafer, it is not possible to form a normal resist pattern, and subsequently there is a risk of forming abnormalities in, for example, an interconnect pattern formed using the resist pattern. For example, if an abnormal resist pattern is used to form a system of interconnects (interconnect pattern), the interconnects can become thinned and peel, and this can affect even normal chips in the surrounding area. Also, if an abnormal resist pattern is used to form holes, the hole diameter could increase and may result in such effects as the sinking of the interlayer film in subsequent process steps.

In the case of patterning a photoresist film on a wafer using lithographic projection exposure, the wafer is generally placed onto a stage and the height is measured over the entire surface of the wafer, using an autofocus sensor. Then, based on the results of the height measurements, the focus is adjusted during the exposure processing, and exposure processing is performed while controlling the stage or the like, so that the surface of the wafer is as parallel as possible with the exposure apparatus. These are disclosed in Japanese Patent Application Publications Nos. JP-A 10-270317 and JP-A 1-264220.

The exposure method and exposure apparatus described in Japanese Patent Application Publications Nos. JP-A 10-270317 and JP-A 1-264220 are configured so that a defocused portion occurring as the result of unwanted matter as mentioned above can be detected by an autofocus scan. According to Japanese Patent Application Publication No. JP-A 10-270317, by issuing an alarm when a defocused portion is detected on the wafer, it is possible to prevent exposure processing from proceeding at that point. According to Japanese Patent Application Publication No. JP-A 1-264220, when a defocused portion is detected on the wafer, the exposure in the direction of movement is stopped, and exposure is performed in the direction that is reversed from the direction of movement, so that there is no poor resolution within the region on the substrate.

In the method and apparatus of Japanese Patent Application Publications Nos. JP-A 10-270317 and JP-A 1-264220, however, if a defocused portion is detected on the wafer, either an alarm is issued to prompt an operator to stop the exposure processing or the exposure processing direction is reversed. For this reason, in Japanese Patent Application Publications Nos. JP-A 10-270317 and JP-A 1-264220, similar to the case described above, it is not possible to form a normal resist pattern at the defocused portions on the wafer, and abnormal interconnect patterns or holes are formed, and this can affect even surrounding normal chips. Also, with the art of Japanese Patent Application Publications Nos. JP-A 10-270317 and JP-A 1-264220, stopping the exposure processing or reversing the processing direction reduces the semiconductor wafer productivity.

In the related art, including that of Japanese Patent Application Publications Nos. JP-A 10-270317 and JP-A 1-264220, as shown in FIG. 10A and FIG. 10B, the autofocus processing is first performed to measure the planarity of the wafer surface and detect defocused portions, and then the exposure scan processing is performed. The scanning is performed in a Y-direction. The exposure position P50 corresponds to the slit. On the surface 201 of the wafer 200, however, between each of the autofocus beams 101 disposed in a direction perpendicular to the scan direction, it is not possible to accurately measure the planarity of the surface 201 of the wafer 200, so that there is a risk, for example, of the detection missing a defocused portion.

Even if the movement of the stage is, for example, compensated at the time of the exposure processing at a part in which there is abnormal planarity on the wafer surface, it is difficult to compensate other than for linear components. For this reason, even if the above-described autofocus scanning is performed and the stage movement is compensated based on information regarding a detected defocused portion, positions occur at which it is not possible to perform localized adjustment of the focus on the wafer surface, the beam becoming defocused at such positions, making it impossible to form a normal pattern.

For this reason, with the method of the related art, in the case in which there is a partial abnormality in the planarity on the wafer surface, an abnormal pattern remains at this position and is allowed to proceed to the subsequent etching process step. The part of the wafer surface with the pattern abnormality was etched as is, this affecting other normal chips downstream in the manufacturing process.

SUMMARY

In one embodiment, an exposure method may include, but is not limited to, the following processes. An autofocus scan process is performed to detect a defocused portion of a first resist film over a semiconductor wafer and to generate a detection signal that indicates the defocused portion detected. A first exposure scan process is performed while selectively blinding the first resist film, with reference to a detection signal related to the defocused portion detected.

In another embodiment, an exposure method may include, but is not limited to, the following processes. Height-direction positions are measured on a surface of a first resist film over a semiconductor wafer. Differences are calculated between measured heights and an adjustable height to identify the differences as calculated defocus values. The measured heights are respectively defined by the height-direction positions measured. The calculated defocus values are compared to a reference defocus value at positions on the surface of the first resist film. The defocused portion is identified at a position where the calculated defocus value exceeds the reference defocus value. A detection signal is generated, which indicates the defocused portion detected. A first exposure scan process is performed while blinding the defocused portion, with reference to the detection signal.

In still another embodiment, an exposure method may include, but is not limited to, the following processes. Height-direction positions are measured on a surface of a first resist film over a semiconductor wafer. A defocused portion is detected with reference to information related to the height-direction positions measured. A first exposure scan process is performed while blinding the defocused portion, with reference to the detection signal.

In yet another embodiment, an exposure apparatus may include, but is not limited to, an autofocus scan processor, an exposure scan processor and a controller. The autofocus scan processor is configured to perform an autofocus scan processing to measure height-direction positions on a surface of a resist film over a semiconductor wafer. The autofocus scan processor is configured to perform a three-dimensional analysis of information of the height-direction positions to generate a detection signal indicating a defocused portion of the resist film. The exposure scan processor includes a selective blinding mechanism that selectively blinds the resist film. The exposure scan processor is configured to perform an exposure process for the resist film. The controller is configured to receive the detection signal indicating the defocused portion from the exposure scan processor. The controller is configured to control the selective blinding mechanism to selectively blind the resist film with reference to the detection signal.

BRIEF DESCRIPTION OF THE DRAWINGS

The above features and advantages of the present invention will be more apparent from the following description of certain preferred embodiments taken in conjunction with the accompanying drawings, in which:

FIG. 5A is a schematic view illustrating blind operations of an exposure scan process, when a defocused portion is detected by an autofocus scan process in the semiconductor wafer exposure method using the exposure apparatus in accordance with an embodiment of the present invention;

FIG. 5B is a side view illustrating motion of the blinding plate in the autofocus scan process where the blinding plate does not cover a slit in the blinding mechanism of FIG. 5A;

FIG. 5C is a side view illustrating motion of the blinding plate in the autofocus scan process where the blinding plate covers the slit in the blinding mechanism of FIG. 5A;

FIG. 5D is a side view illustrating a scanning area of a semiconductor wafer with a defocused portion;

FIG. 10A is a view illustrating an exposure method for a semiconductor wafer in related art; and FIG. 10B is a graph illustrating a detection signal obtained by the autofocus scanning process shown in FIG. 10A.

DETAILED DESCRIPTION OF THE PREFERRED EMBODIMENTS

Figure 1:
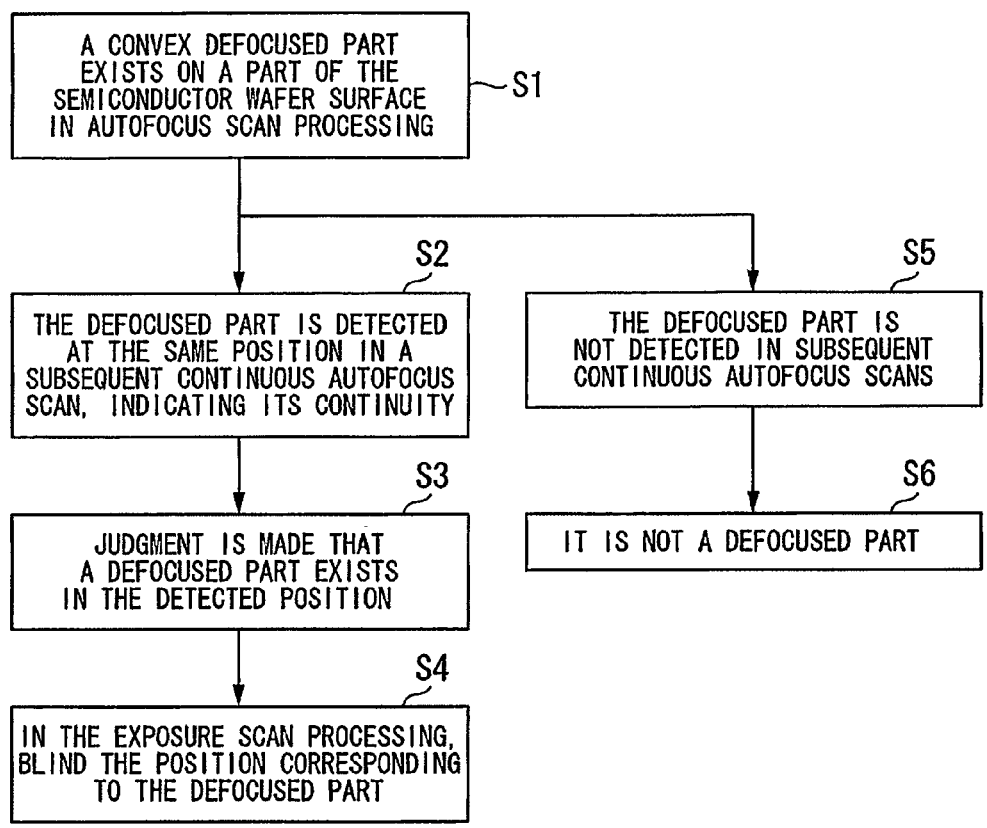
FIG. 1 is a flow chart illustrating an exposure method for a semiconductor wafer in accordance with an embodiment of the present invention.

Before describing the present invention, the related art will be explained briefly, in order to facilitate the understanding of the present invention.

As described above, in a method of exposing a semiconductor wafer and exposure apparatus according to the related art, it has been difficult to accurately detect a defocused portion using an autofocus scan before the exposure scan processing. Also, because either the scanning is stopped or the scanning direction is reversed when a defocused portion is detected, the productivity is reduced. When a defocused portion is detected, if etching is performed on the abnormal pattern formed at that position, because other normal chips are affected in the manufacturing process, the yield will decrease.

For this reason, there has been a desire for an exposure method and an exposure apparatus enabling accurate detection of a defocused portion and also enabling manufacture of semiconductor wafers without a drop in productivity or yield, even if a defocused portion is detected.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, an exposure method may include, but is not limited to, the following processes. An autofocus scan process is performed to detect a defocused portion of a first resist film over a semiconductor wafer and to generate a detection signal that indicates the defocused portion detected. A first exposure scan process is performed while selectively blinding the first resist film, with reference to a detection signal related to the defocused portion detected.

In some cases, the first resist film may be selectively blinded by selectively blinding the defocused portion.

In some cases, the first resist film may be selectively blinded by selectively blinding other portion of the resist film than the defocused portion. In some cases, the autofocus scan process may be performed by illuminating exposure beams of light on the first resist film at a scanning pitch of at most 1 mm.

In some cases, performing the autofocus scan process may include, but is not limited to, measuring height-direction positions on a surface of the first resist film; and performing a three-dimensional analysis of information of the height-direction positions to detect the defocused portion.

In some cases, performing the first exposure scan process may include, but is not limited to, moving at least a blinding plate to extend across an exposure slit and to blind the defocused portion, with reference to the detection signal.

In some cases, performing the first exposure scan process may further include, but is not limited to, storing an identification information identifying the semiconductor wafer and the information of the height-direction positions. The at least one of blinding plates is moved with reference to the identification information and the information of the height-direction positions.

In some cases, the method may further include, but is not limited to, removing the first resist film from the semiconductor wafer, forming a second resist film over the semiconductor wafer, and performing a second exposure scan process for the second resist film while moving a same at least one of blinding plates as the at least one of blinding plates moved in the first exposure scan process, and to blind a same position of the second resist film as the position blinded in the first exposure scan process, with reference to the identification information and the information of the height-direction positions.

In some cases, the method may further include, but is not limited to, removing the first resist film from the semiconductor wafer, forming a second resist film over the semiconductor wafer, and performing a second exposure scan process for the second resist film while blinding a same position of the second resist film as the position blinded in the first exposure scan process with reference to the detection signal.

In some cases, performing the autofocus scanning process may further include, but is not limited to, measuring height-direction positions on a surface of the first resist film, and detecting the defocused portion with reference to information related to the height-direction positions measured.

In some cases, performing the autofocus scanning process may further include, but is not limited to, calculating differences between measured heights and an adjustable height to identify the differences as calculated defocus values, the measured heights being respectively defined by the height-direction positions measured; comparing the calculated defocus values to a reference defocus value at positions on the surface of the first resist film; and identifying the defocused portion at a position where the calculated defocus value exceeds the reference defocus value.

In some cases, performing the autofocus scanning process may further include, but is not limited to, performing an additional autofocus scanning process which is the same as the autofocus scanning process; determining that the defocused portion is present at the same position as the position where the defocused portion was identified, if the defocused portion is identified at the same position when performing the additional autofocus scanning process; and determining that the defocused portion is absent at the same position as the position where the defocused portion was identified, if the defocused portion is not identified at the same position when performing the additional autofocus scanning process.

In some cases, performing the autofocus scanning process may further include, but is not limited to, detecting heights and inclinations of the surface of the first resist film from the height-direction positions measured; and detecting the defocused portion with reference to the heights and the inclinations detected.

In some cases, detecting the defocused portion with reference to the heights and the inclinations detected may include, but is not limited to, calculating high and inclination baselines from the height-direction positions measured; determining whether a focused plane is offset from a base-plane which is made by the high and inclination baselines; and determining whether the focused plane has a three-dimensionally upwardly bulging shape.

In some cases, the first exposure scan process may be performed immediately after the autofocus scan process is performed.

In another embodiment, an exposure method may include, but is not limited to, the following processes. Height-direction positions are measured on a surface of a first resist film over a semiconductor wafer. Differences are calculated between measured heights and an adjustable height to identify the differences as calculated defocus values. The measured heights are respectively defined by the height-direction positions measured. The calculated defocus values are compared to a reference defocus value at positions on the surface of the first resist film. The defocused portion is identified at a position where the calculated defocus value exceeds the reference defocus value. A detection signal is generated, which indicates the defocused portion detected. A first exposure scan process is performed while blinding the defocused portion, with reference to the detection signal.

In some cases, performing the first exposure scan process may include, but is not limited to, moving at least a blinding plate to extend across an exposure slit and to blind the defocused portion, with reference to the detection signal.

In some cases, performing the first exposure scan process may further include, but is not limited to, storing an identification information identifying the semiconductor wafer and the information of the height-direction positions. The at least one of blinding . plates is moved with reference to the identification information and the information of the height-direction positions.

In still another embodiment, an exposure method may include, but is not limited to, the following processes. Height-direction positions are measured on a surface of a first resist film over a semiconductor wafer. A defocused portion is detected with reference to information related to the height-direction positions measured. A first exposure scan process is performed while blinding the defocused portion, with reference to the detection signal.

In some cases, the exposure method may further include, but is not limited to, detecting heights and inclinations of the surface of the first resist film from the height-direction positions measured. The detecting the defocused portion may include, but is not limited to, detecting the defocused portion with reference to the heights and the inclinations detected.

In some cases, detecting the defocused portion with reference to the heights and the inclinations detected may include, but is not limited to, the following processes. High and inclination baselines are calculated from the height-direction positions measured. A determination is made on whether a focused plane is offset from a base-plane which is made by the high and inclination baselines. A determination is made on whether the focused plane has a three-dimensionally upwardly bulging shape. In yet another embodiment, an exposure apparatus may include, but is not limited to, an autofocus scan processor, an exposure scan processor and a controller. The autofocus scan processor is configured to perform an autofocus scan processing to measure height-direction positions on a surface of a resist film over a semiconductor wafer. The autofocus scan processor is configured to perform a three-dimensional analysis of information of the height-direction positions to generate a detection signal indicating a defocused portion of the resist film. The exposure scan processor includes a selective blinding mechanism that selectively blinds the resist film. The exposure scan processor is configured to perform an exposure process for the resist film. The controller is configured to receive the detection signal indicating the defocused portion from the exposure scan processor. The controller is configured to control the selective blinding mechanism to selectively blind the resist film with reference to the detection signal.

In some cases, the selective blinding mechanism may include, but is not limited to, an exposure slit and a plurality of blinding plates which is movable to extend across the exposure slit.

In some cases, the controller is configured to move at least one of the plurality of blinding plates to extend across the exposure slit, with reference to the detection signal, to selectively blind the resist film.

In some cases, the exposure apparatus may further include, but is not limited to, a defocusing information storage unit configured to store an identification information identifying the semiconductor wafer and information of the height-direction positions.

In some cases, the controller is configured to acquire the identification information and the information of the height-direction positions from the defocusing information storage unit. The controller is configured to move at least one of the plurality of blinding plates with reference to the identification information and the information of the height-direction positions.

First Embodiment:

A method of exposing a semiconductor wafer and exposure apparatus that are embodiments of the present invention are described below, referring to FIG. 1 through FIG. 9. The drawings referenced in the following description are for the purpose of describing embodiments of the method of exposing a semiconductor wafer and exposure apparatus, and sizes, thicknesses, and other dimensions and the like of various elements shown in the drawings differ from the dimensional relationships in an actual exposure apparatus and the like.

An embodiment of a method of exposing a semiconductor wafer is a method, in manufacturing a semiconductor wafer 1, whereby a photoresist film 2 is formed on the semiconductor wafer 1 that has been placed onto a non-illustrated stage, and then exposure scan processing is performed with respect to the photoresist film 2 using lithography, whereby a resist pattern is formed. Autofocus scan processing that detects a defocused portion 21 on the photoresist film 2 is performed immediately before the exposure scan processing. The exposure scan processing is a method whereby feedback control that is based on a detection signal for the defocused portion 21 detected in the autofocus scan processing, the exposure being done while blinding the defocused portion 21 so that the resist pattern is caused to remain at the defocused portion 21 on the semiconductor wafer 1.

In this embodiment, the case of forming a resist pattern on the surface 1a of the semiconductor wafer 1 by the above-described exposure method using an exposure apparatus 10 such as shown in FIGS. 5A, 5B, 5C, and 5D and FIGS. 6A and 6B, for example, is described herein as an example.

The exposure apparatus 10 for the semiconductor wafer 1 according to the present embodiment, after forming a photoresist film 2 onto the semiconductor wafer 1 placed on a non-illustrated stage, forms a resist pattern by performing lithographic exposure scan processing with respect to the photoresist film 2. The exposure apparatus 10 is generally configured to include an AF (autofocus) scan processor 30 that recognizes and detects a defocused portion 21 of the photoresist film 2 on the semiconductor wafer 1, by performing three-dimensional analysis of the height information obtained by performing autofocus scan processing to measure the height-direction position on the surface of the photoresist film 2 immediately before the exposure scan processing; an exposure scan processor 40 that has an exposure slit 41 that passes a beam B of exposure light, and a plurality of rectangular-shaped blinding plates 42 in a comb-tooth configuration movably provided in an exposure slit 41 proximal region so that they are perpendicular to the longitudinal direction of the exposure slit 41; and a controller 80 that blinds (blocks the light to) a position along the exposure slit 41 corresponding to a defocused portion 21 by moving at least one part of the plurality of blinding plates 42 provided on the exposure scan processor 40, based on a detection signal, by feeding back the detection signal of the defocused portion 21 that has been the output from the AF scan processer 30 to the exposure scan processor 40. In the example shown in FIGS. 5A, 5B, 5C, and 5D, the exposure slit 41 is provided by the combination of two slitted plates 41A opposing one another.

As described above, while there is in recent years an increase in the diameter of semiconductor wafers and an increase in the amount of surface area per scan in the lithographic exposure step as a cost-reduction consideration, the adoption of micropatterns, the use of a high numerical aperture, and the use of shorter wavelengths have brought a narrowing of the DOF margin, thereby increasing the frequency of occurrence of defocusing. Also, because reduced pattern sizes have resulted in narrower interconnects, patterns tend to peel away, and there is risk that the resulting scattering of airborne particles can affect surrounding normal chips.

With respect to such matters, in the present embodiment the existence or absence of a defocused portion and the position thereof are detected from information in the autofocus scan processing that is performed immediately before the lithographic exposure scan processing. Then, when the exposure scan processing is performed, blinding is performed in a region corresponding to a defocused portion within the range of the exposure scan. In this manner, by not exposing a defocused portion on the semiconductor wafer, it is possible to prevent the occurrence of pattern peeling and the like, and to avoid affecting surrounding normal chips in subsequent process steps. Additionally, the ID and the position information (region to be blinded) for a semiconductor wafer on which a defocused portion is detected are recorded and managed, to enable limitation of the exposure light at the defocused portion in subsequent processing steps as well, by limiting the exposure light in the same region by blinding in all subsequent exposure scan processing steps. By doing this, because in subsequent processing, that is, in the formation of the upper layer of the semiconductor wafer, the exposure light is limited in the region that is the same as that of the defocused portion in all exposure steps, the same position of the wafer becomes covered with photoresist film, thereby avoiding affecting surrounding normal chips.

The method for exposure of a semiconductor wafer according to this embodiment is described below in detail.

This embodiment is described by way of a positive-type resist as an example, in which patterning is performed on the photoresist film 2 using lithography, which removes the photoresist film 2 at locations illuminated by light to form a resist pattern. Such a positive-type resist pattern (photoresist film) has a very good resolution, enabling the highly precise formation of micropatterns.

First, in the same manner as in the method of the related art of exposing a semiconductor wafers, patterning is performed by lithography, and the semiconductor wafer 1, onto the surface of which has been formed a photoresist film 2, is placed onto a non-illustrated stage provided in the exposure apparatus 10. An alternative procedure is that of placing the semiconductor wafer 1 onto a stage and then forming the photoresist film 2 thereon.

Figure 2A:
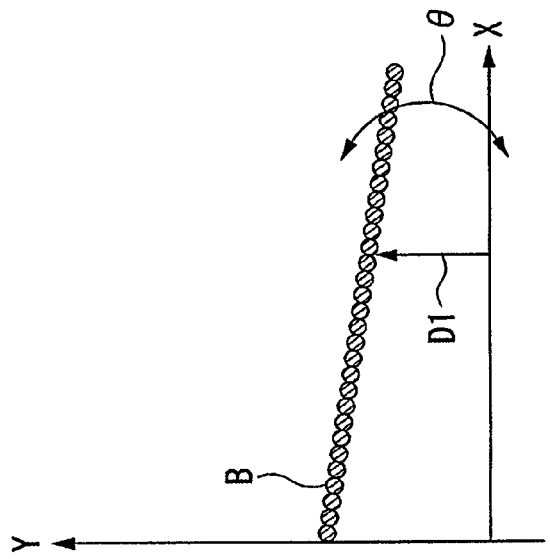
FIG. 2A is a view illustrating an exposure method for a semiconductor wafer wherein an autofocus scanning process is performed by illuminating a high density array of beams of light and without blinding when no defocused portion is present.
Figure 2B:
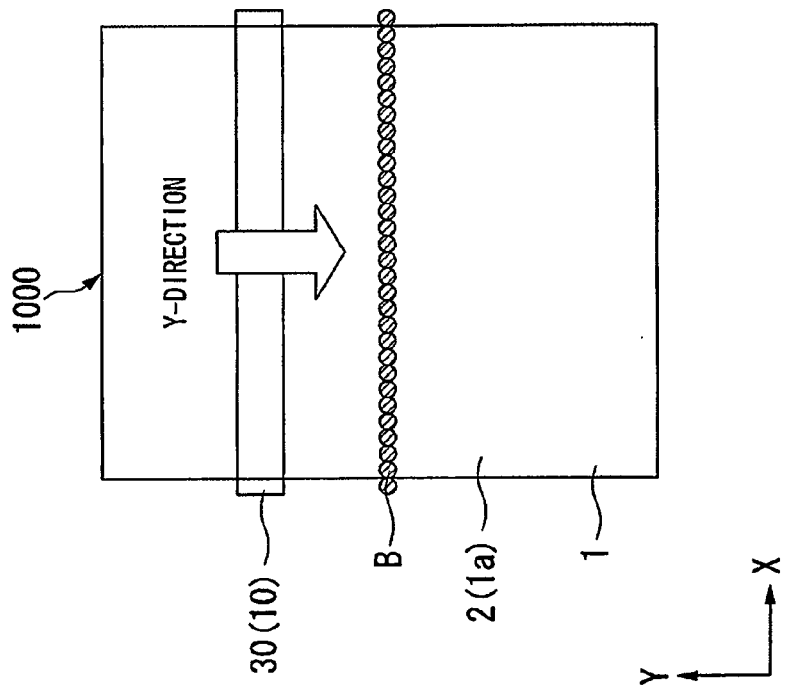
FIG. 2B is a graph illustrating a detection signal obtained by the autofocus scanning process shown in FIG. 2A when no defocused portion is detected.

Next, in performing exposure scan processing of the surface 1a of the semiconductor wafer 1 in this condition, an autofocus scan is performed immediately before the exposure scan processing, to detect defocused portions 21. As the AF scan processor 30 for performing autofocus scanning, it is possible to use a sensor that can optically measure the height-direction position information on the surface 1a of the semiconductor wafer 1 by illuminating it with a scanning bean (beam B). As shown in FIGS. 2A and 2B, the autofocus scan processing is performed successively over the entire surface 1a of the semiconductor wafer 1.

When doing this, the AF scan processor 30 recognizes and detects a defocused portion 21 of the photoresist film 2 by, for example, performing three-dimensional processing of the height information of the surface 1a of the semiconductor wafer 1 by an analysis unit 70, using the above-described autofocus scanning. Then, for each measured position on the surface 1a of the semiconductor wafer 1, the difference between the results of the height measurement of the surface 1a and the adjustable height within which compensation is possible by operation of a stage or the like at the time of exposure is calculated. The difference between an actual measured height value and the adjustable height at the time of exposure is taken as the defocus value at that position. At each position on the surface 1a of the semiconductor wafer 1, the defocus value is compared with a precalculated defocus value that would result in an improper pattern formation during exposure scanning, and a position having a defocus value that exceeds that value is taken to be a defocused portion 21.

FIG. 1 is a flow chart illustrating an exposure method for a semiconductor wafer in accordance with an embodiment of the present invention. An autofocus scanning process is performed to detect a defocusing portion of a resist film to generate a detection signal. The detection signal is fed back to perform an exposure process with selectively blinding a corresponding portion to a defocusing portion.

As shown in the flowchart of FIG. 1, in step S1, a defocused portion 21 is recognized on the surface 1a of the semiconductor wafer 1 in the autofocus scanning process, the following processing is performed.

First, in step S2, autofocus scanning is performed continuously, and if a defocused portion is detected at one and the same position in a plurality of scans, in step S3 a judgment is made that it is clear that a defocused portion 21 exists at the detected position. If, in step S5, continuous autofocus scanning is performed, but a subsequent scan does not detect the defocused portion 21, in step S6 the judgment is made that a defocused portion 21 does not exist. In this embodiment, by performing the processing for recognition and detection of a defocused portion 21 as shown in FIG. 1, detection accuracy is improved, thereby achieving the effect of improved productivity.

Then, in the case of step S3 in which the judgment has been made that a defocused portion 21 exists at some position on the surface 1a of the semiconductor wafer 1, in step S4 the detection signal for detecting the defocused portion 21 is fed back to the exposure scan processing, and blinding (light blocking) is performed so that exposure scanning is not done at that part. Specifically, the exposure scan processor 40 of the exposure apparatus 10 is used to perform the following processing, which forms a resist pattern by performing exposure scan processing of the photoresist film 2.

First, the detection signal for the defocused portion 21 recognized and detected using the autofocus scan processing by the AF scan processor 30 is fed back, via a controller 80, to the exposure scan processor 40 shown in FIG. 5A through FIG. 5D. FIG. 5B shows the normal exposure scanning. FIG. 5B shows the blinding exposure scanning. As shown in FIG. 5A, FIG. 5B, and FIG. 5C, by the controller 80 performing feedback control, the exposure scan processor 40, based on the detection signal for the defocused portion 21, causes at least a part corresponding to the position of the defocused portion 21 among a plurality of rectangular blinding plates 42 that are disposed in a comb-tooth configuration in an exposure slit 41 proximal region to move perpendicularly to the longitudinal direction of the exposure slit 41. By doing this, as shown in FIG. 5D, exposure scanning proceeds as the position along the exposure slit 41 corresponding to the defocused portion 21 (refer to FIGS. 3A and 3B and FIGS. 4A and 4B) is blinded by the blinding plates 42 and the area 1000 of the wafer surface is exposed.

It is preferable in the present embodiment for blinding the exposure scan light is a part of the optical system, that is, a unit that blocks the exposure slit 41 through which exposure light passes. Also, it is preferable that the unit to block the exposure slit 41 is such that it blinds at least a part of the exposure slit 41 by moving long, narrow blinding plates 42 arranged in a line at one side of the exposure slit 41 in forward and reverse directions using drive mechanism 43, which uses a piezoelectric effect or the like. If such a method is used, even if there are defocused portions 21 existing simultaneously in a plurality of areas on the surface 1a of the semiconductor wafer 1, it is possible to reliably blind all positions that correspond to each of the defocused portions 21.

Figure 6A:
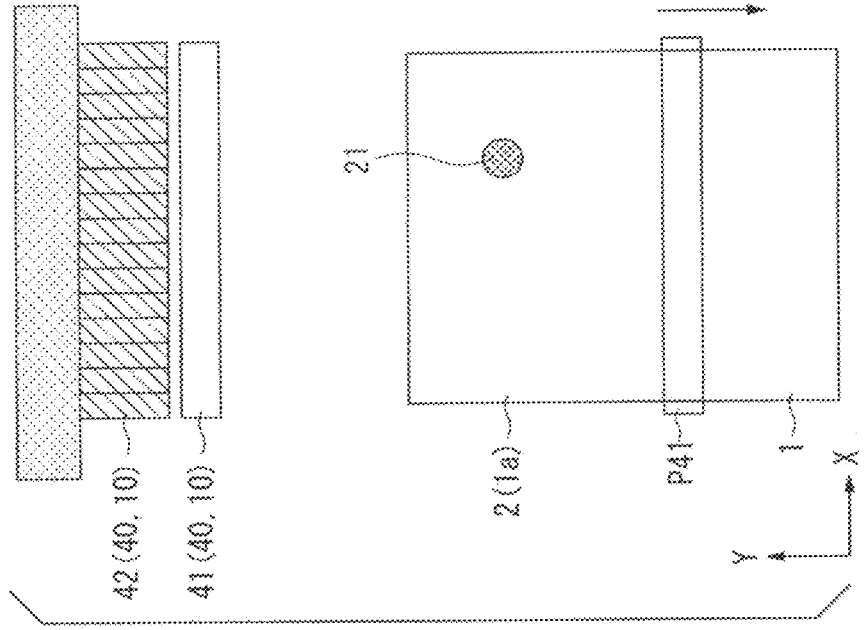
FIG. 6A is a schematic view illustrating a selective blind operations in an exposure scan process, when a defaced portion is detected by an autofocus scan process in the semiconductor wafer exposure method using the exposure apparatus in accordance with an embodiment of the present invention.
Figure 6B:
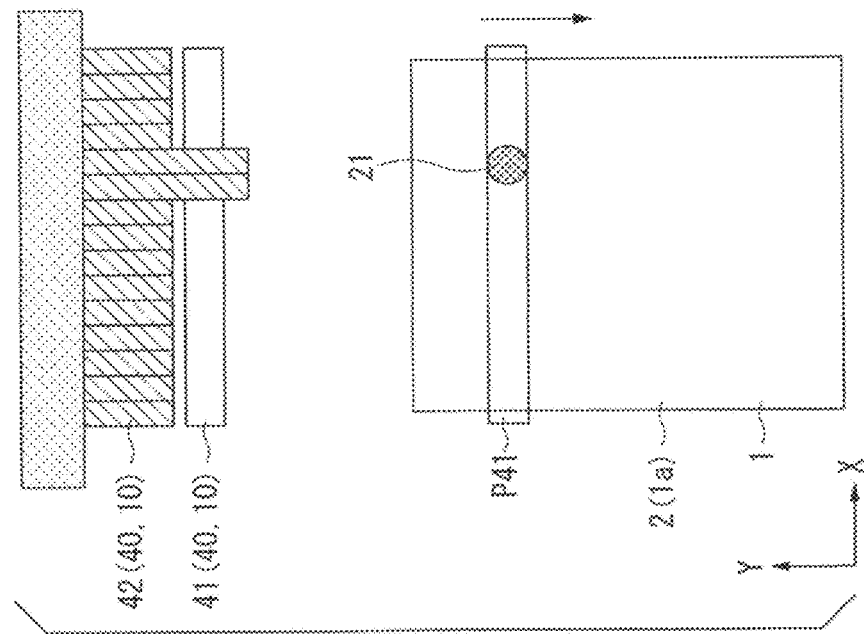
FIG. 6B is a schematic view illustrating non-blind operations of an exposure scan process, when a defaced portion is detected by an autofocus scan process in the semiconductor wafer exposure method using the exposure apparatus in accordance with an embodiment of the present invention.

As shown in FIG. 6A and FIG. 6B, a scanning exposure apparatus such as the exposure apparatus 10 according to the present embodiment illuminates only a part of a reticule by light that passes through the exposure slit 41 and, by controlling the blinding plates 42, blocks a part of the light passing through the exposure slit 41. In FIGS. 6A and 6B, P41 represents the exposure position corresponding to the slit 41. When exposing (passing illumination to) a position P41 at which a defocused portion 21 has been detected on the semiconductor wafer 1 beforehand by autofocus scanning, a blinding (blocking) operation is performed at the position corresponding to the defocused portion 21, as shown in FIG. 6A. In contrast, when exposing a position P41 at which the focus is normal, blocking of the exposure slit 41 is not done, as shown in FIG. 6B.

Figure 7A:
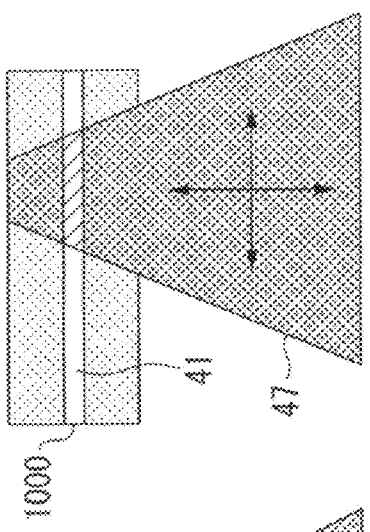
FIG. 7A is a view illustrating a selective blind operations in an exposure scan process, when a defaced portion is detected by an autofocus scan process in the semiconductor wafer exposure method using the exposure apparatus in accordance with an embodiment of the present invention.
Figure 7B:
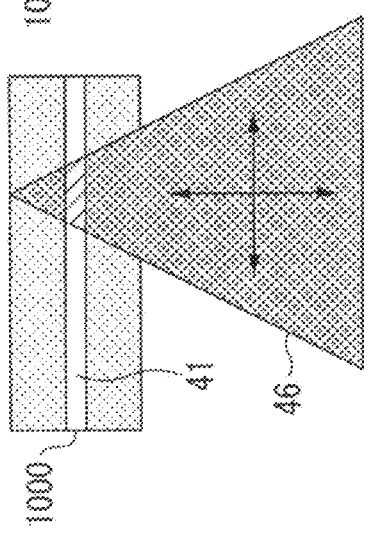
FIG. 7B is a view illustrating a selective blind operations in an exposure scan process, when a defaced portion is detected by an autofocus scan process in the semiconductor wafer exposure method using the exposure apparatus in accordance with an embodiment of the present invention.
Figure 7C:
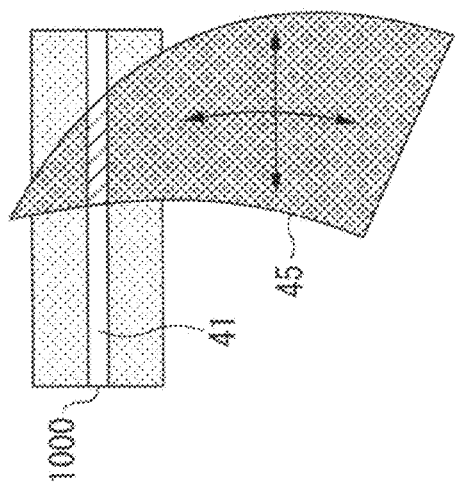
FIG. 7C is a view illustrating a selective blind operations in an exposure scan process, when a defaced portion is detected by an autofocus scan process in the semiconductor wafer exposure method using the exposure apparatus in accordance with an embodiment of the present invention.
Figure 7D:
FIG. 7D is a cross sectional view of FIGS. 7A, 7B, and 7C.

The unit to block the exposure slit in the present embodiment is not limited to the above-described blinding plates. For example, as shown in FIG. 7A through FIG. 7D, a half-crescent shaped blinding plate 45 (FIG. 7A), a triangular blinding plate 46 (FIG. 7B), or a trapezoidal blinding plate 47 (FIG. 7C) or the like may be used in combination, a method being adopted that moves these blinding plates forward/back and left/right or rotates them to control the blocking position and size, where FIG. 7D shows the exposure area 1000 of the exposure slit 41.

In the present embodiment, in performing the autofocus scan processing of the surface 1a of the semiconductor wafer 1 using the AF scan processor 30, from the standpoint of enabling accurate and thorough detection of defocused portions, it is preferable, as shown in FIGS. 3A and 3B and FIGS. 4A and 4B, that the beam B that is caused to strike the photoresist film 2 on the semiconductor wafer 1 strikes with beams arranged to have a density with a scan pitch of 1 mm or smaller. The defocused portion 21 is illustrated in FIGS. 3A, 3B, 4A and 4B.

Figure 3B:
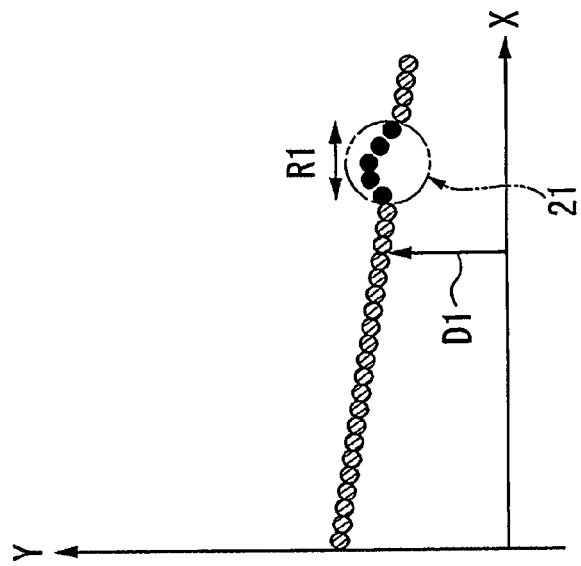
FIG. 3B is a graph illustrating a detection signal obtained by the autofocus scanning process shown in FIG. 3A when a defocused portion is detected.
Figure 3A:
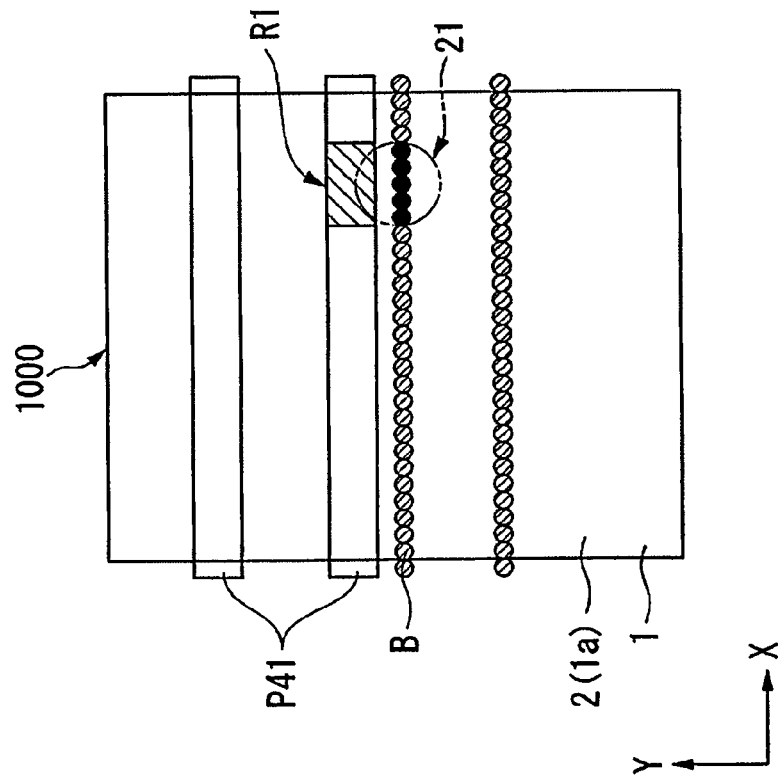
FIG. 3A is a view illustrating an exposure method for a semiconductor wafer wherein an autofocus scanning process is performed by illuminating a high density array of beams of light and with blinding when a defocused portion is present.
Figure 4B:
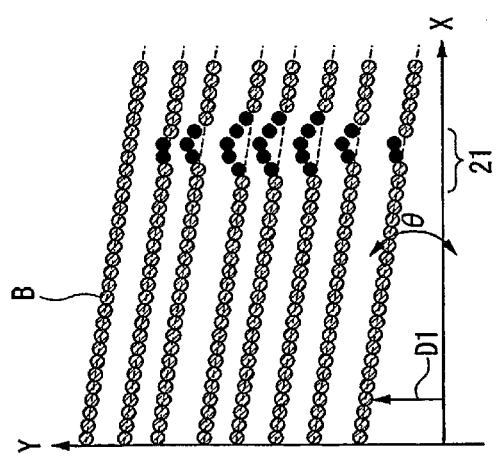
FIG. 4B is a plan view illustrating relationships between the detection signals of FIG. 4A ad a defocused portion over a semiconductor wafer.
Figure 4A:
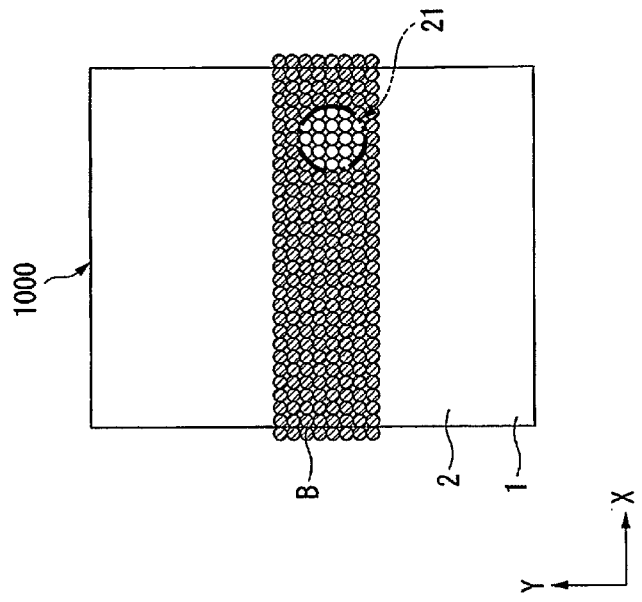
FIG. 4A is a graph illustrating detection signals obtained by the autofocus scanning process when the defocused portion is detected.

In this case, as shown in FIG. 3A and FIG. 3B, a plurality of beams B are arranged in the width direction with respect to the scan direction. The surface 1a is subjected to autofocus scanning by the beam B immediately before exposure scanning, where a plurality of beam B striking points are disposed on the surface 1a. Then, as shown in FIG. 4A and FIG. 4B, by performing the autofocus scan with the plurality of beams B arranged with high density, the height D1 and inclination 8 on the surface 1a are detected from the surface positions detected at each striking point, by detection of the presence or absence of defocusing with high precision, enabling feedback control.

In the present embodiment, by concentrating the arrangement density of the beam B, which performs an autofocus scan immediately before the exposure scan, on many points with a scanning pitch of 1 mm or smaller, it is possible to perform reliable detection of even smaller defocusing. In the present embodiment, with regard to the judgment criterion for existence or absence of defocusing when performing the autofocus scanning with the beam B striking points arranged with a density as mentioned above, the following setting can be made.

(a) the case in which, upon performing a least-squares calculation of the height and inclination baseline from surface positions detected by a large number of beam striking points and performing a comparison with this baseline, there are continuous detections of a point at which the focus is upwardly convex and also exceeds the allowable DOF for this process step (reticule).

(b) the case in which continuous points at which defocusing occurs are detected continuously in the autofocus scanning direction as well.

In the case in which the above-described cases (a) and (b) occur simultaneously, that is, the case in which the focus plane is offset from the base plane in only a certain area within the autofocus scan range, if there is a three-dimensionally upwardly bulging shape, it is possible to judge that defocusing exists within that shot.

In the present embodiment, in performing the autofocus scan and the exposure scan using an exposure apparatus 10 configured as mentioned above, the constitutions of the focus mechanism and the blinding plate driver used in the exposure apparatus 10 are not particularly restricted. With regard to the focus mechanism, the blinding plate drive mechanism and the like in the present embodiment, it is possible to use the related art, for example as recited in Japanese Patent Application Publication No. JP-A 10-270317.

Figure 8:
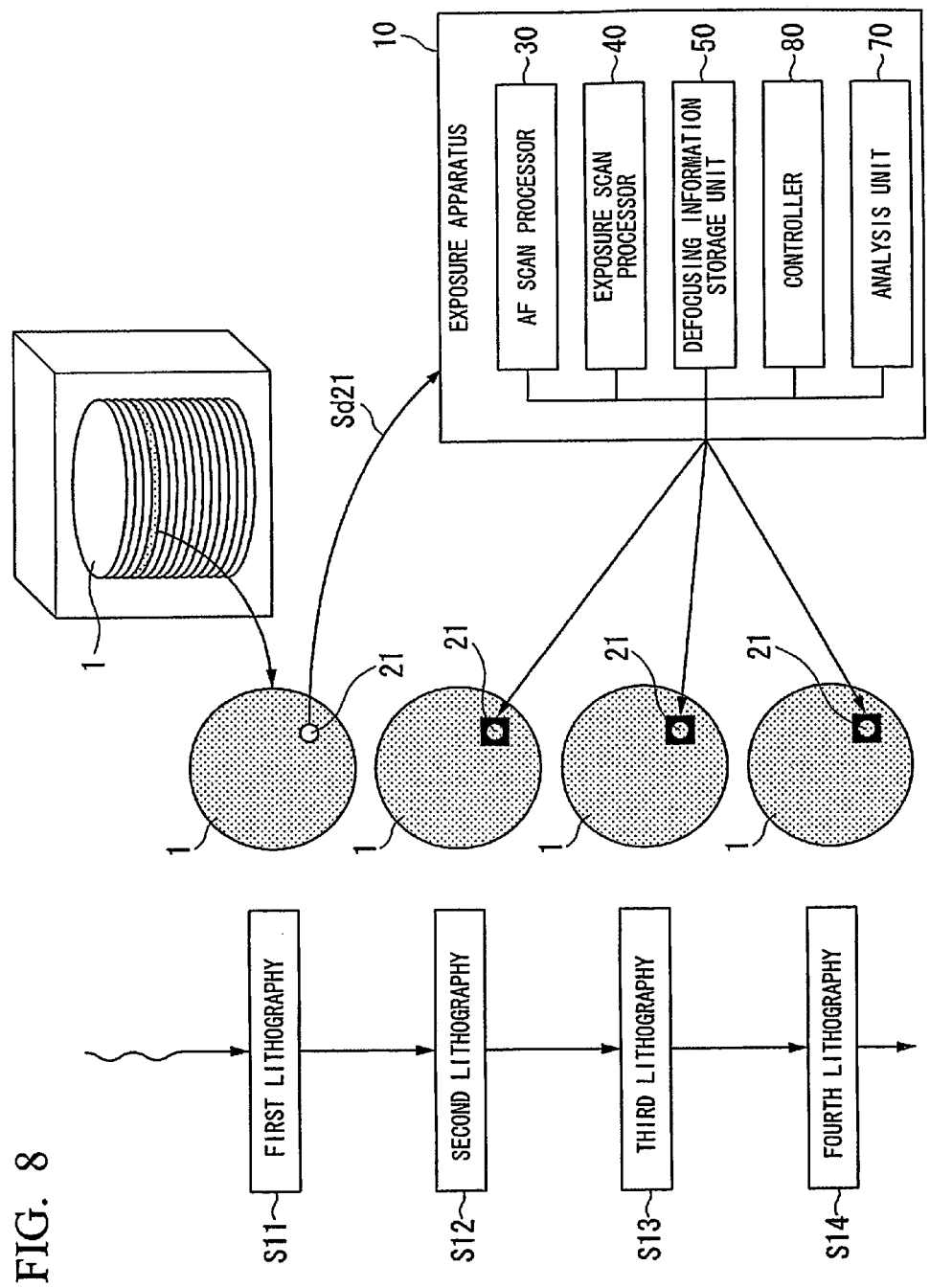
FIG. 8 is a schematic view illustrating an exposure system including an exposure apparatus including a controller and a storage unit in accordance with an embodiment of the present invention.

Also, in the present embodiment as shown in FIG. 8, the above-described exposure scan processing may further adapt a configuration in which the ID and the position information for a semiconductor wafer 1 on which a defocused portion 21 has occurred is acquired by a controller 80 provided in the exposure apparatus 10 by using an analysis unit 70 and the controller 80 then stores the data in a defocusing information storage unit 50 such as a server or the like. In this case, the controller 80 provided in the exposure apparatus 10 acquires the ID and position information for a semiconductor wafer 1 on a defocused portion 21 has occurred, which the defocusing information storage unit 50 had stored. The controller 80 sends the ID and position information to the exposure scan processor 40. Then, based on the semiconductor wafer 1 ID and position information, as shown in FIG. 5A through FIG. 5D, at least a part of the plurality of blinding plates 42 provided in the exposure scan processor 40 are caused to move so as to perform exposure scanning while blinding a position along the exposure slit 41 corresponding to a defocused portion 21.

By adopting the above-described constitution, when the occurrence of defocusing is detected midway in the manufacturing process of a semiconductor wafer, it is possible in subsequent process steps to limit the exposure in the same region by automatic blinding operations, regardless of whether there is defocusing or not in subsequent exposure scan processing steps. In the example shown in FIG. 8, after detection of a defocused portion 21 on the semiconductor wafer 1 in the lithography step 1 (S11), in all of the subsequent lithography steps 2 through 4 (S12, S13 and S14), exposure scanning is performed while blinding the position corresponding to the defocused portion 21. In this manner, when a defocused portion is detected, by limiting exposure in all subsequent steps in which exposure scanning is performed, the wafer becomes covered with photoresist film in the same position in the planar direction, so that it is possible to avoid affecting surrounding normal chips.

If the present embodiment is applied not to the patterning of a photoresist film as used to describe this embodiment, but rather to the semiconductor wafer base process steps, because chips in that part do not perform prescribed circuit operations, it is preferable that that part be covered with a photoresist film in subsequent process steps.

When performing lithographic exposure scan processing in this embodiment, scanning information regarding the occurrence of a defocused portion is instantaneously detected from the immediately prior autofocus scan processing information, and blinding is performed that limits the exposure over a range corresponding to the defocused portion. By not exposing a defocused portion on a semiconductor wafer in this manner, peeling of interconnect patterns is prevented, and affecting surrounding normal chips in subsequent process steps is avoided. Additionally, by recording and managing the ID and position information for a semiconductor wafer on which a defocused portion has occurred at the start of manufacturing and limiting exposure of the same regions by blinding, it is possible by limiting the exposure in the defocused portion in subsequent process steps to avoid having this matter extend even to surrounding normal chips.

In the related art, when skipping exposure scanning in units of semiconductor chips is performed, a photoresist film (with no patterning) remains so as to cover the semiconductor chips for one shot of exposure (all the semiconductor chips existing on the photomask and formed simultaneously), and in exposure developing and dry etching, the pattern precision of neighboring chips was affected. For this reason, with the adoption of micropatterns in semiconductors as seen in recent years, there has been a desire that there be no locations on a semiconductor wafer having non-uniform patterning.

In the present embodiment, by blinding (blocking light) as described above, a position at which defocusing occurs is covered with a photoresist film with pinpoint precision. By intentionally not forming patterns on a defocused portion on a semiconductor wafer in this manner, because the defocused portion is not etched, it is possible to reduce the effect to surrounding normal chips by element pattern peeling and the effect on subsequent process steps.

In the present embodiment, by detecting a defocused portion by autofocus scanning and blinding the part simultaneously with the exposure scan, it is possible to prevent a reduction of throughput and to improve productivity.

Additionally, in the present embodiment, by adopting a constitution in which the defocused portion detection signal Sd21 is stored as the semiconductor wafer ID and position information in a defocusing information storage unit that is a server or the like, it is possible to avoid adversely affecting all subsequent process steps.

Although this embodiment is mainly described using the example of forming positive-type resist, the method of exposing a semiconductor wafer and exposure apparatus of the present embodiment are not limited in that manner, and can be applied also a negative-type resist.

Figure 9:
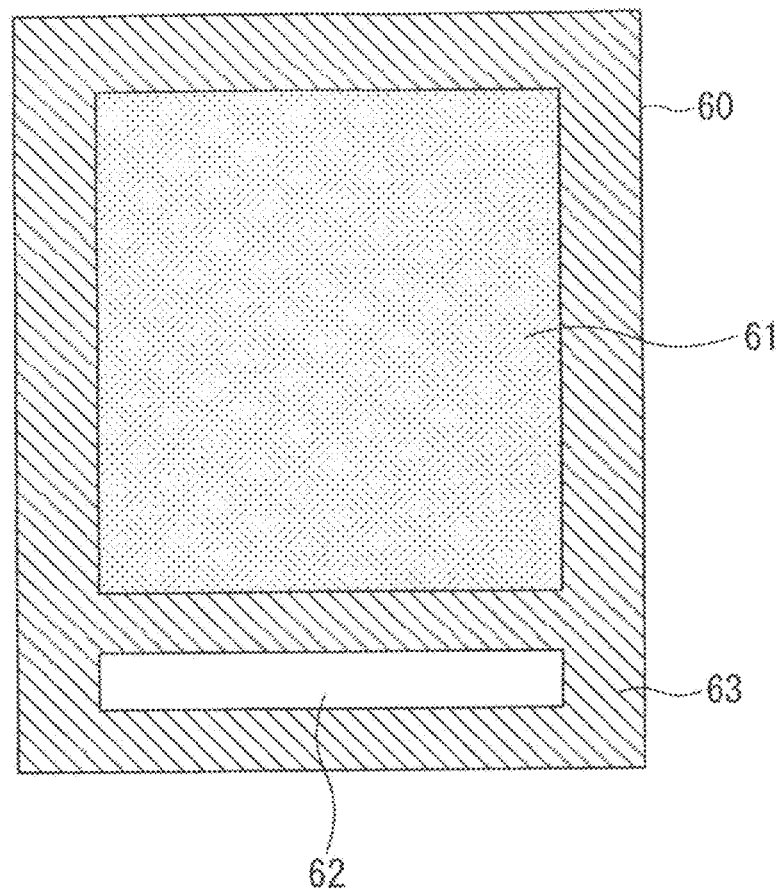
FIG. 9 is a plan view illustrating a reticle used in a case that a negative resist is sued for an exposure method.

In such cases, a transparent region 62 (region in which there is no pattern) having a width that is the same as that of the usual exposure region 61 (region of the chip having a pattern) is provided at the end part of the reticule 60, as shown in FIG. 9. In the case of forming a negative-type resist on a semiconductor wafer, rather than performing the above-described blinding operation, exposure is first done over the entire region of the semiconductor wafer, and the chip is patterned, after which movement is performed to a chip at a defocused portion on the wafer that had previously been detected, and the defocused portion only is illuminated with light, with an aperture opened at only a part of the light-passing region 62 of the reticule. When this is done, an exposure region 61 on the reticule having a pattern of a chip is completely blocked from light by a blinding mechanism having a constitution differing from that in the above-described embodiment.

A blinding mechanism similar to the one described in the above-described embodiment may be used for opening only a part of the light-passing region 62. If this method is used, by striking the defocused portion with light, the negative-type resist can be caused to remain so as to cover that location.

As described above, according to the exposure method for the semiconductor wafer 1 of the present embodiment, in addition to the above-described constitution enabling accurate detection of a defocused portion 21, when performing exposure during the exposure scan processing to expose regions that include a region in which defocusing occurs, because exposure illumination is not done on the defocused portion 21, it is possible to leave a resist pattern so as to cover only the defocused portion 21. By doing this, in subsequent process steps the defocused portion 21 is not subjected to etching, while it is possible to perform precise etching of the parts other than the defocused portion 21. Therefore, even in the case of exposure scanning of a semiconductor wafer 1 that includes a defocused portion 21, abnormalities of the interconnect pattern or holes, which are caused by abnormalities in the resist pattern in the defocused portion 21, do not occur, and surrounding normal chips are not affected, making it possible to manufacture the semiconductor wafer 1 without a decrease in productivity and yield.

According to the exposure apparatus 10 for the semiconductor wafer 1 of the present embodiment, by the above-described constitution, because exposure illumination is not done at the defocused portion 21 during the exposure scan processing, it is possible to leave a resist pattern that covers only the defocused portion 21, so that the defocused portion 21 is not etched in subsequent process steps, and so that the regions other than the defocused portion 21 are properly etched. Therefore, similar to what is described above, abnormalities of the interconnect pattern or holes, which are caused by abnormalities in the resist pattern in the defocused portion 21, do not occur, and surrounding normal chips are not affected, making it possible to manufacture the semiconductor wafer 1 without a decrease in productivity and yield.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. An exposure method comprising:
performing an autofocus scan process to detect a defocused portion of a first resist film over a semiconductor wafer and to generate a detection signal that indicates the defocused portion detected; and
performing a first exposure scan process while selectively blinding the first resist film, with reference to the detection signal.

2. The exposure method according to claim 1, wherein selectively blinding the first resist film comprises selectively blinding the defocused portion.

3. The exposure method according to claim 1, wherein selectively blinding the first resist film comprises selectively blinding other portion of the resist film than the defocused portion.

4. The exposure method according to claim 1, wherein performing the autofocus scan process comprises:
illuminating exposure beams of light on the first resist film at a scanning pitch of at most 1 mm.

5. The exposure method according to claim 1, wherein performing the autofocus scan process comprises:
measuring height-direction positions on a surface of the first resist film; and performing a three-dimensional analysis of information of the height-direction positions to detect the defocused portion.

6. The exposure method according to claim 5, wherein performing the first exposure scan process comprises:
moving at least a blinding plate to extend across an exposure slit and to blind the defocused portion, with reference to the detection signal.

7. The exposure method according to claim 6, wherein performing the first exposure scan process further comprises:
storing an identification information identifying the semiconductor wafer and the information of the height-direction positions, and
wherein the at least one of blinding plates is moved with reference to the identification information and the information of the height-direction positions.

8. The exposure method according to claim 7, further comprising:
removing the first resist film from the semiconductor wafer;
forming a second resist film over the semiconductor wafer; and
performing a second exposure scan process for the second resist film while moving a same at least one of blinding plates as the at least one of blinding plates moved in the first exposure scan process, and to blind a same position of the second resist film as the position blinded in the first exposure scan process, with reference to the identification information and the information of the height-direction positions.

9. The exposure method according to claim 1, further comprising:
removing the first resist film from the semiconductor wafer;
forming a second resist film over the semiconductor wafer; and
performing a second exposure scan process for the second resist film while blinding a same position of the second resist film as the position blinded in the first exposure scan process with reference to the detection signal.

10. The exposure method according to claim 1, wherein performing the autofocus scanning process comprises:
measuring height-direction positions on a surface of the first resist film, and
detecting the defocused portion with reference to information related to the height-direction positions measured.

11. The exposure method according to claim 10, wherein performing the autofocus scanning process further comprises:
calculating differences between measured heights and an adjustable height to identify the differences as calculated defocus values, the measured heights being respectively defined by the height-direction positions measured;
comparing the calculated defocus values to a reference defocus value at positions on the surface of the first resist film; and
identifying the defocused portion at a position where the calculated defocus value exceeds the reference defocus value.

12. The exposure method according to claim 10, wherein performing the autofocus scanning process further comprises:
performing an additional autofocus scanning process which is the same as the autofocus scanning process;
determining that the defocused portion is present at the same position as the position where the defocused portion was identified, if the defocused portion is identified at the same position when performing the additional autofocus scanning process; and
determining that the defocused portion is absent at the same position as the position where the defocused portion was identified, if the defocused portion is not identified at the same position when performing the additional autofocus scanning process.

13. The exposure method according to claim 10, wherein performing the autofocus scanning process further comprises:
detecting heights and inclinations of the surface of the first resist film from the height-direction positions measured; and
detecting the defocused portion with reference to the heights and the inclinations detected.

14. The exposure method according to claim 13, wherein detecting the defocused portion with reference to the heights and the inclinations detected comprises:
calculating high and inclination baselines from the height-direction positions measured;
determining whether a focused plane is offset from a baseplane which is made by the high and inclination baselines; and
determining whether the focused plane has a three-dimensionally upwardly bulging shape.

15. An exposure method comprising:
measuring height-direction positions on a surface of a first resist film over a semiconductor wafer;
calculating differences between measured heights and an adjustable height to identify the differences as calculated defocus values, the measured heights being respectively defined by the height-direction positions measured;
comparing the calculated defocus values to a reference defocus value at positions on the surface of the first resist film;
identifying the defocused portion at a position where the calculated defocus value exceeds the reference defocus value;
generating a detection signal that indicates the defocused portion detected; and
performing a first exposure scan process while blinding the defocused portion, with reference to the detection signal.

16. The exposure method according to claim 15, wherein performing the first exposure scan process comprises:
moving at least a blinding plate to extend across an exposure slit and to blind the defocused portion, with reference to the detection signal.

17. The exposure method according to claim 16, wherein performing the first exposure scan process further comprises:
storing an identification information identifying the semiconductor wafer and the information of the height-direction positions, and
wherein the at least one of blinding plates is moved with reference to the identification information and the information of the height-direction positions.

18. An exposure method comprising:
measuring height-direction positions on a surface of a first resist film over a semiconductor wafer;
detecting a defocused portion with reference to information related to the height-direction positions measured; and
performing a first exposure scan process while blinding the defocused portion, with reference to the detection signal.

19. The exposure method according to claim 18, further comprising:
   detecting heights and inclinations of the surface of the first resist film from the height-direction positions measured; and
   wherein the detecting the defocused portion comprises detecting the defocused portion with reference to the heights and the inclinations detected.

20. The exposure method according to claim 19, wherein detecting the defocused portion with reference to the heights and the inclinations detected comprises:
   calculating high and inclination baselines from the height-direction positions measured;
   determining whether a focused plane is offset from a base-plane which is made by the high and inclination baselines; and
   determining whether the focused plane has a three-dimensionally upwardly bulging shape.

* * * * *